United States Patent
Lai et al.

(10) Patent No.: US 9,537,078 B2
(45) Date of Patent: Jan. 3, 2017

(54) MANUFACTURING PROCESS OF THE THERMOELECTRIC CONVERSION ELEMENT

(71) Applicant: NATIONAL TSING HUA UNIVERSITY, Hsinchu (TW)

(72) Inventors: Mei-Feng Lai, Hsinchu (TW); Zung-Hang Wei, Hsinchu (TW); Hao-Ting Huang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/546,739

(22) Filed: Nov. 18, 2014

(65) Prior Publication Data
US 2016/0035958 A1 Feb. 4, 2016

(30) Foreign Application Priority Data
Jul. 31, 2014 (TW) .............................. 103126303 A

(51) Int. Cl.
*H01L 35/34* (2006.01)
*H01L 35/28* (2006.01)
*H01L 35/14* (2006.01)

(52) U.S. Cl.
CPC ............... *H01L 35/34* (2013.01); *H01L 35/14* (2013.01); *H01L 35/28* (2013.01)

(58) Field of Classification Search
CPC ........... H01L 35/34; H01L 35/28; H01L 35/14
See application file for complete search history.

(56) References Cited

U.S. PATENT DOCUMENTS

| 8,508,370 B1* | 8/2013 | El-Kady | G08B 13/14 |
| | | | 340/568.1 |
| 2011/0059568 A1* | 3/2011 | Chao | B82Y 10/00 |
| | | | 438/54 |

OTHER PUBLICATIONS

"Enhanced magneto-thermoelectric power factor of a 70 nm Ni-nanowire" by R. Mitdank et. al. on Journal of Applied Physics 111, 104320 (2012).*

* cited by examiner

*Primary Examiner* — Julio J Maldonado
*Assistant Examiner* — Farun Lu
(74) *Attorney, Agent, or Firm* — Muncy, Geissler, Olds & Lowe, P.C.

(57) ABSTRACT

A manufacturing process of the thermoelectric conversion element is provided, wherein the system using semiconductor process technology to the construction of the thermoelectric conversion element nanoscale thermoelectric effect to increase, and the use of different type and surface state of the sample to increase the thermoelectric conversion element thermoelectric figure of merit. Through the use of a specific thickness of deposition of nanostructures on a nanoscale roughening of the substrate cannot affect the conductivity of thermoelectric materials under, and also can improve the Seebeck coefficient and lower thermal conductivity in order to significantly enhance the thermoelectric figure of merit.

4 Claims, 11 Drawing Sheets

MANUFACTURING PROCESS OF THE THERMOELECTRIC CONVERSION ELEMENT

CROSS-REFERENCE TO RELATED APPLICATION

This application claims priority from Taiwan Patent Application No. 103126303, filed on Jul. 31, 2014, in the Taiwan Intellectual Property Office, the content of which are hereby incorporated by reference in their entirety for all purposes.

BACKGROUND OF THE INVENTION

1. Field of the Invention

The present invention relates to a manufacturing process of a thermoelectric conversion element, in particular with respect to a thermoelectric conversion element having a nanostructure on a surface thereof.

2. Description of the Related Art

When facing the gradual exhaustion of the global primary energy as well as the more and more critical greenhouse effect, development along with application of renewable energy has become an issue in an urgent need. The technique of thermoelectric conversion, which converts thermal energy of the primary energy into a more valuable electric energy, does not have noises and byproducts in the process of the conversion as having no movable parts, and thus, it matches up the green energy of a concept of environmental protection.

More and more scholars have been engaging in the development of nanotechnology, enabling the related research on the thermoelectric conversion element becoming a doctrine gradually. However, the limitation of thermoelectric material degrades the conversion efficiency. Wherein the thermoelectric conversion element is standardized by the thermoelectric figure of merit $$ZT = \frac{S^2 T \sigma}{k},$$

and S is Seebeck coefficient, T is absolute temperature, $\sigma$ is electrical conductivity of the material, k is thermal conductivity. As the formula shows, increasing electrical conductivity of the material, or Seebeck coefficient S or decreasing thermal conductivity k all can enhance the thermoelectric figure of merit of elements so as to boost the thermoelectric conversion efficiency. The aforementioned parameters, however, are not individual, such that any one of them is not able to be fixed without affecting the remains, and thermoelectric figure of merit can't be boosted unlimitedly.

The thermal conductivity k and the electrical conductivity $\sigma$ normally show a positive correlation change based on Wiedemann-Franz law $$LT = \frac{k}{\sigma},$$

wherein L is the Lorenz number of material, and when any of the thermal conductivity k or electrical conductivity $\sigma$ is changed, the other corresponding parameters will change too, enabling that the thermoelectric figure of merit ZT doesn't have obvious modification. Consequently, metal material is less applied to the thermoelectric conversion element.

Compared with metal material, semiconductor material has better advantage of Seebeck coefficient S, and an order of magnitude difference of the Seebeck coefficient S is between the two materials. As semiconductor material is of lower thermal conductivity k, it is the commonly seen type used in the thermoelectric material. Because the electrical conductivity $\sigma$ of semiconductor material is hard to be enhanced, most thermoelectric figure of merits of the existing thermoelectric conversion elements are less than 2, resulting that the technique has a long way to run in practical application.

In addition, regarding the prior art, it also uses semiconductor material as a substrate and then dopes a certain proportions or types of rare earth elements to adjust the effective electron concentration in the semiconductor material an as to enhance the thermoelectric figure of merit by boosting the electrical conductivity $\sigma$. But, by doping rare earth elements to change the electrical conductivity $\sigma$ still has a technical bottleneck. For example, firstly, rare earth elements are not easy to obtain and the price thereof is expensive; secondly, the doping uniformity is not easy to be controlled; thirdly, the manufacturing process is too complicated, . . . and so on and so forth, leading the current thermoelectric conversion element to an unpopular way.

According to the preceding description, inventor of the present invention therefore designs a manufacturing process of a thermoelectric conversion element which aims to improve the shortcomings of the current technique so as to boost the industrial practicability.

SUMMARY OF THE INVENTION

In view of the aforementioned technical problems, the present invention is to provide a manufacturing process of a thermoelectric conversion element which uses a semiconductor manufacturing process technique to construct a thermoelectric conversion element having nanoscale or microscale structure. By changing element's size and roughness, it can increase the scattering percentage of hot carriers in the element without affecting the thermal conductivity of the thermoelectric material, and cold and hoe ends of the element are able to maintain at higher temperature difference, as well as to decrease the thermal conductivity of the element. As a result, it can greatly boost the thermoelectric figure of merit of the thermoelectric conversion element.

In view of the aforementioned technical problems, a manufacturing process of a thermoelectric conversion element provided by the present invention is accomplished by a semiconductor manufacturing process technique which can simplify the complicated manufacturing process of the known manufacturing process of a thermoelectric conversion element, and is applicable to be integrated into the general semiconductor integrated circuit component, and easy to be produced massively.

According to the preceding purposes, the present invention is to provide a manufacturing process of a thermoelectric conversion element which may comprise the following steps: a) providing a substrate and manufacturing a microstructure having a nanoscale or a micron-scale roughness and at least comprising two-dimensional variation on the substrate; b) disposing a thermoelectric material on the substrate to form an element having a nanoscale or a micron-scale roughness and at least comprising two-dimensional variation; and c) respectively constructing contact electrodes at two ends of the element to enable the element guiding an electrical energy converted from a thermal energy for using.

Preferably, a manufacturing process of a thermoelectric conversion element may further comprise emptying the substrate beneath the element by an etching process to suspend the element to prevent the thermal conductivity of the substrate directly or indirectly affecting the thermal conversion efficiency of the thermoelectric conversion element.

Preferably, the thermoelectric material may comprise a rare earth element compound, a silicon-based material, a semiconductor material, a ferromagnetic material or a metal material, wherein a deposition thickness of the thermoelectric material may be between 5 nm and 1 µm.

Preferably, the element may comprise a straight line, a wave line, a Zigzag line or a thin film in aspect.

Preferably, when the thermoelectric material is the ferromagnetic material, using a magnetic field to provide diverse magnetic field intensities to change a thermal conductivity of the thermoelectric material so as to boost the thermoelectric figure of merit.

According to the aforementioned purpose, the present invention further provides a manufacturing process of a thermoelectric conversion element which may comprise: a) providing a substrate and preparing a microstructure having nanoscale and comprising at least two-dimensional variation on a surface of the substrate; b) disposing a ferromagnetic thermoelectric material on the microstructure to form a wave nanostructure having uniform thickness and comprising at least two-dimensional variation; and; c) respectively disposing magnetic field electrodes on a direction corresponding to two sides of the wave nanostructure; and d) respectively constructing contact electrodes at two ends of the wave nanostructure to provide input/output electrical signal for an external device.

Preferably, the magnetic field electrodes may provide a magnetic field to increase a magnetic wall effect of the wave nanostructure so as to decrease a thermal conductivity of the ferromagnetic thermoelectric material.

Preferably, a deposition thickness of the ferromagnetic thermoelectric material may be between 5 nm and 5 µm.

According to the aforementioned purpose, the present invention further provides a manufacturing process of a thermoelectric conversion element which may comprise following steps: a using a manufacturing process to prepare a thermoelectric material as a porous thermoelectric thin film; and b) respectively constructing contact electrodes at two sides of the porous thermoelectric thin film to enable the porous thermoelectric thin film guiding an electrical energy converted from a thermal energy for using.

Preferably, the manufacturing process may comprise a deposition process, a developing process, an etching process or a combination thereof.

Preferably, when the manufacturing process is the deposition process, depositing the thermoelectric material on a porous substrate to form the porous thermoelectric thin film.

Preferably, with the different thicknesses of the thin film on the porous substrate, the element may be gradually changed from the porous reticulated thin film to a thin film structure having a nanoscale or a micro-scale roughness which may also contribute the thermoelectric element to boost the thermoelectric figure of merit.

Preferably, when the manufacturing process is the developing process, using a mask to develop to directly manufacture the porous thermoelectric thin film having a reticular structure on a substrate.

Preferably, when the manufacturing process is the etching process, using an etching technique to directly etch the thermoelectric material as the porous thermoelectric thin film having a porous boundary on the thermoelectric material.

Preferably, the thermoelectric material may comprise a rare earth element compound, a silicon-based material, a semiconductor material, a ferromagnetic material or a metal material, wherein a deposition thickness of the thermoelectric material may be between 5 nm and 5 µm.

Preferably, when the thermoelectric material is the ferromagnetic material, using a magnetic field to provide diverse magnetic field intensities to change a thermal conductivity of the thermoelectric material so as to boost the thermoelectric figure of merit of the porous thermoelectric thin film.

The primary purpose of the present invention is to provide a manufacturing process of a thermoelectric conversion element which may have various advantages as follows:

1. Micro design: manufacturing a thermoelectric conversion element of nanoscale or micro-scale structure by a semiconductor manufacturing process technique, and it can be effectively integrated into the electric components used in the semiconductor industry.

2. Application of waste heat: dissipating the waste heat generated by a system or converting it into other usable energy formations.

3. Energy conservation: using the extra waste heat generated by elements of a system, and converting it into electric energy to greatly decrease the need of electricity consumption for the electric products as well as to lower the burden to the environment caused by human being so as to reach the purpose of saving energy.

4. Breaking the limitation of material: it can be found through the experiment result that when metal material of nanoscale or micro-scale structure is served as the thermoelectric conversion element, the thermoelectric figure of merit thereof is better than that using the known rare earth element.

5. Decreasing cost: as the thermoelectric conversion element developed by the present invention can also use metal material as element, the source of material can be ensured and the cost can be effectively lowered as well, such that the need of the rare earth element is therefore decreased greatly.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

Hereinafter, embodiments of the present invention will be described in detail with reference to the accompanying drawings so that those skilled in the art to which the present invention pertains can realize the present invention, wherein.

DETAILED DESCRIPTION OF THE PREFERRED EMBODIMENTS

Hereinafter, embodiments of the present invention will be described in detail with reference to the accompanying drawings so that those skilled in the art to which the present invention pertains can realize the present invention. As those skilled in the art would realize, the described embodiments may be modified in various different ways, all without departing from the spirit or scope of the present invention.

The exemplary embodiments of the present invention will be understood more fully from the detailed description given below and from the accompanying drawings of various embodiments of the invention, which, however, should not be taken to limit the invention to the specific embodiments, but are for explanation and understanding only.

Electrical conductivity σ, Seebeck coefficient S and thermal conductivity k and the related parameters of a thermoelectric material may be affected by change of the material properties such as band structure, band gap and density of state (DOS) and so on. The preceding material properties may have diverse changes with the diversity of material's size and growing section and so on.

Moreover, materials of lower dimensional structures enable the material's scattering level increasing and further to lower thermal conductivity k; consequently, when the thermoelectric material is shown in lower dimensional aspect (i line or thin film), the thermal conductivity k is lower than that of bonded bulk material structures; and provided that the material's size is down to nanoscale, thermal conductivity k thereof is revised down again to boost the thermoelectric figure of merit ZT.

As a result, the present invention is to use the mature semiconductor manufacturing process technique to construct a thermoelectric conversion element having nanoscale or micro-scale size by a disposing process on a surface of a substrate having microstructure, and using the difference on the surface of the microstructure to increase the difficulty of transmitting hot carriers so as to decrease thermal conductivity k of a thermoelectric material.

Figure 1:
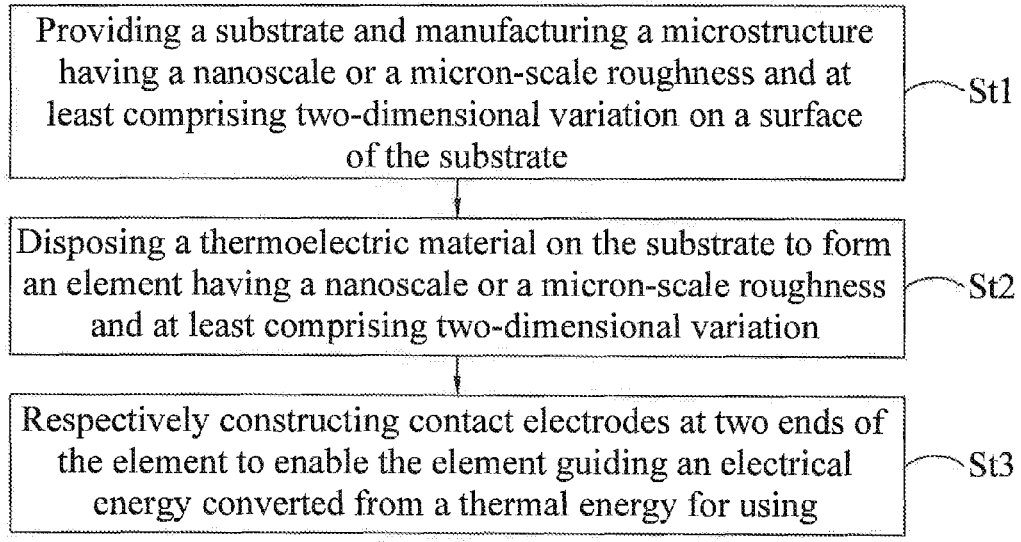
FIG. 1 is a flow chart of a manufacturing process of a thermoelectric conversion element of the present invention.

Please refer to FIG. 1 which is a flow chart of a manufacturing process of a thermoelectric conversion element of the present invention. Further refer to FIG. 2B and FIG. 2C, which are the cross section diagram and the SEM image of the thermoelectric conversion element of the present invention. As the FIGs. show, in St1, manufacturing a microstructure 201 having a nanoscale or a micro-scale roughness and comprising at least two-dimensional variation by a manufacturing process on a surface of a substrate 20, wherein constructing a shield area by means of photoresist or mask, excluding the specific areas, and then conducting the roughening process with at least two-dimensional variation by the surface roughening technique in the specific areas, and the surface roughening technique comprises the roughening processes such as dry etching, wet etching, abrasive jet and so on, but is shall not be subject to this restriction.

In St2, disposing the thermoelectric material 21 on the substrate 20 to form an element 211 having a nanoscale or a micro-scale roughness and comprising at least two-dimensional variation, wherein the element 211 having a nanoscale or a micro-scale roughness is able to effectively decrease the thermal conductivity of the element so as to boost the thermoelectric figure of merit of the element.

In practice, it can use the disposing techniques such as evaporation deposition, physical vapor deposition, coating deposition or electroplate deposition collocating with the substrate of roughened surface to construct the thermoelectric conversion element having completed internal structure but microstructure of nanoscale on surface.

In practice, aspect of the element comprises a straight line, a wave line, a Zigzag line or a thin film, and the thermoelectric material comprises a rare earth element compound, a silicon-based material, a semiconductor material, a ferromagnetic material or a metal material.

Figure 2A:
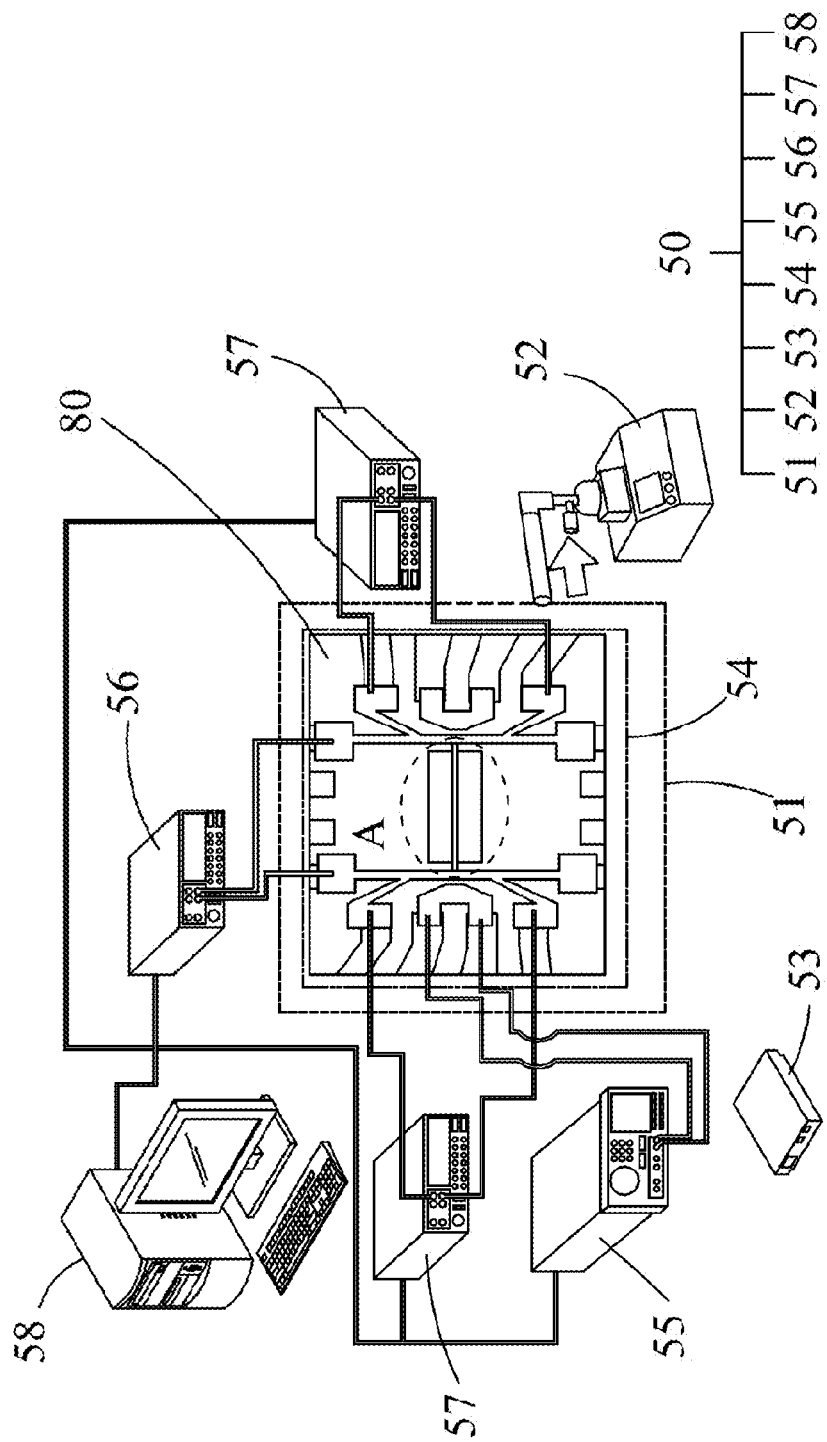
FIG. 2A is a schematic diagram of an arrangement of a measuring system for a manufacturing process of a thermoelectric conversion element of the present invention.
Figure 2B:
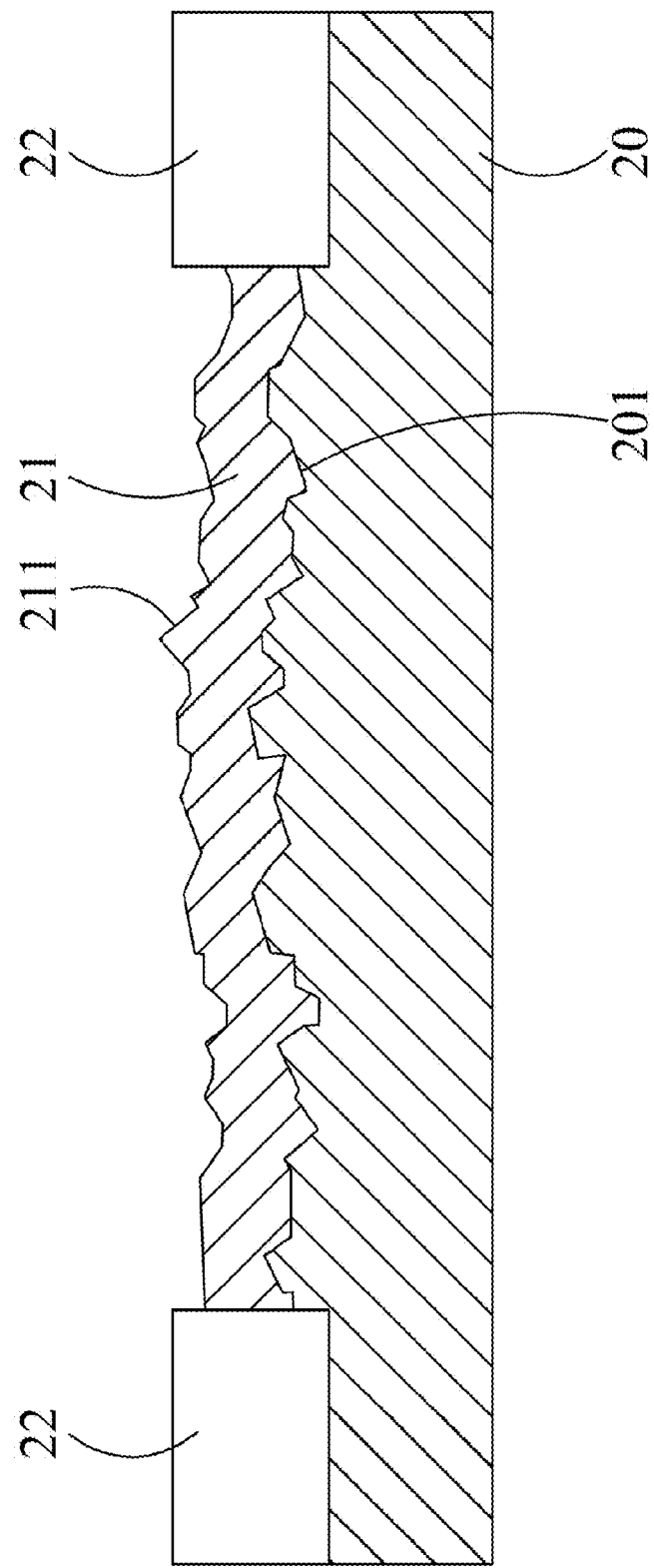
FIG. 2B is a cross section diagram of a thermoelectric conversion element of the present invention.
Figure 2C:
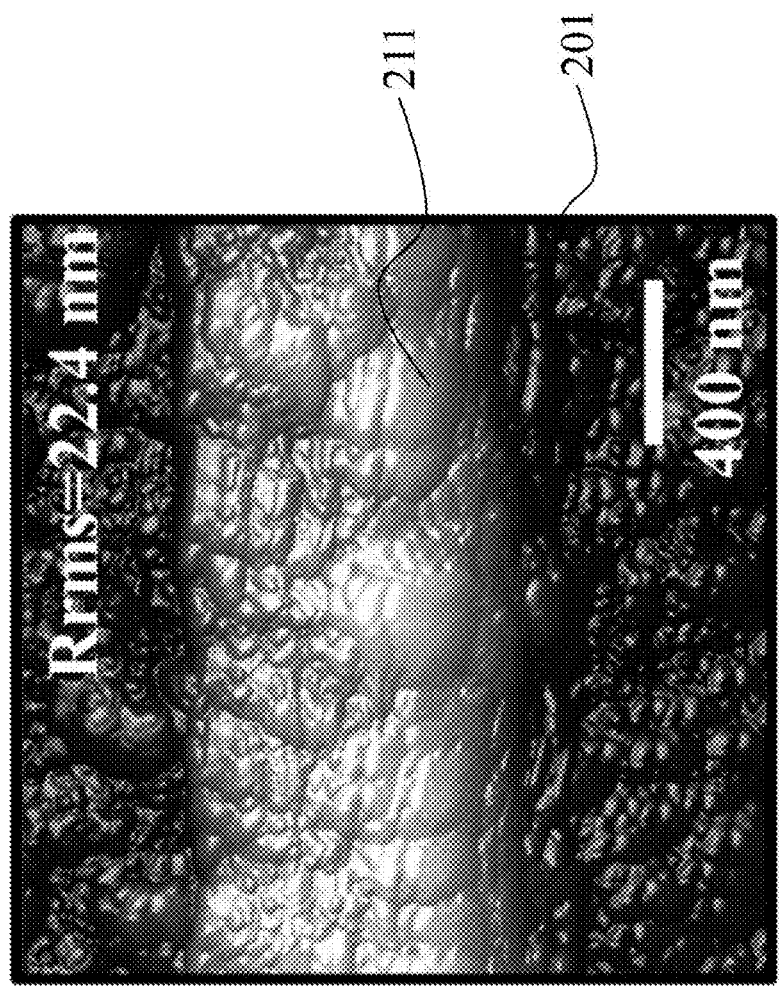
FIG. 2C is a SEM image of a thermoelectric conversion element of the present invention.
Figure 2D:
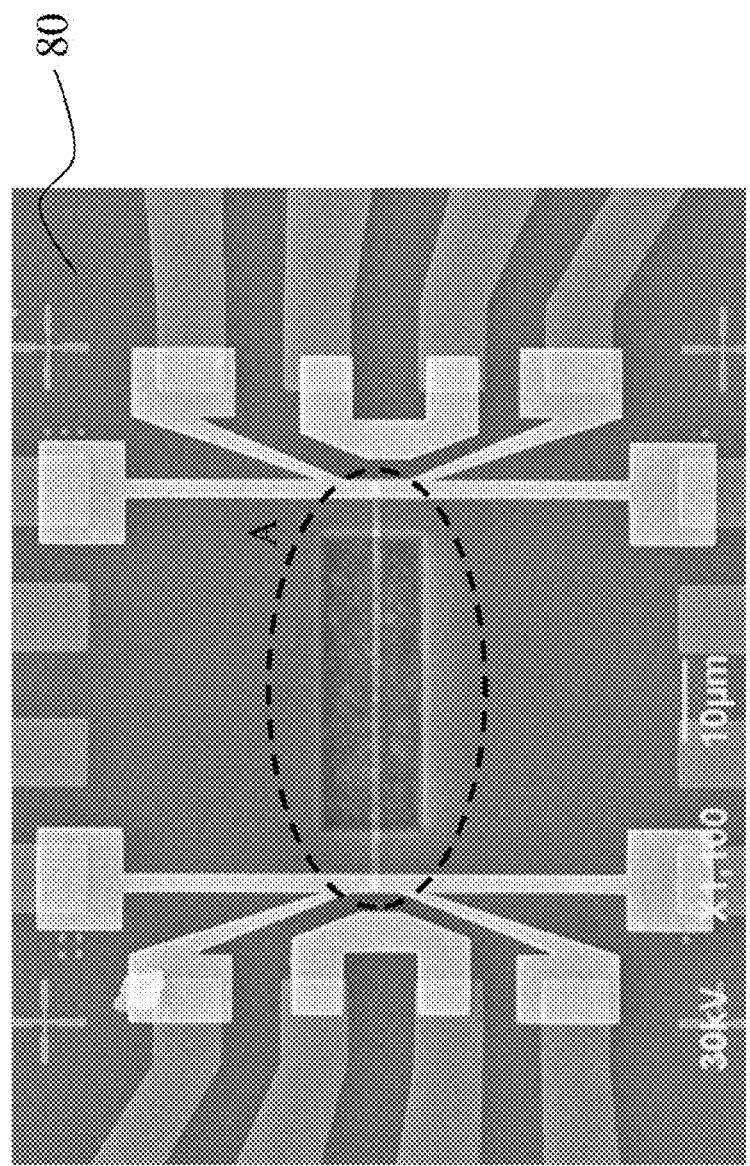
FIG. 2D is a SEM image of a nanoscale test piece of the present invention.
Figure 2E:
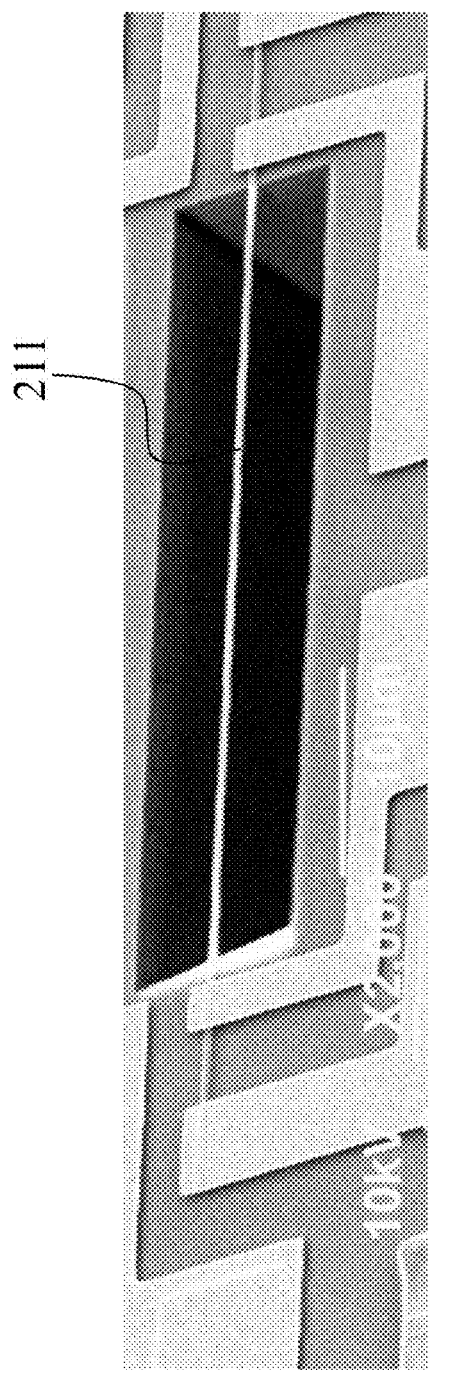
FIG. 2E is a SEM image of a suspended thermoelectric conversion element (circle part A of FIG. 2D) of the present invention.

In St3, respectively constructing contact electrodes 22 at two ends of the element 211 to enable the element 211 guiding the electric energy converted from a thermal energy for using. Further refer to FIG. 2D, which is the SEM image of the nanoscale test piece 80 as shown in FIG. 2A and also refer to FIG. 2E, which is the SEM image of a suspended thermoelectric conversion element 211 as the circle part A indicated in FIG. 2D. If necessary, it uses an etching process to empty the substrate beneath the element 211 to enable the element 211 suspending to prevent the thermal conductivity of the substrate directly or indirectly affecting the thermal conversion efficiency of the thermoelectric conversion element (as shown in the circle part A).

Please refer to FIG. 2A which is a schematic diagram of an arrangement of a measuring system for a manufacturing process of a thermoelectric conversion element of the present invention. It can be seen from the FIG. 2A that a measuring system 50 comprises a vacuum chamber 51, a vacuum pump 52, a cryogenic temperature control module 53, a measuring platform 54, a power supply 55, a nanovoltmeter 56, a multi-purpose electronic measurer 57 and a processing module 58.

As nanoscale test piece 80 is easy to be disturbed by external environment such that the data reliability is affected, so when conducting experimental measuring, it has to place the test piece 80 adequately to the measuring platform 54, and then place it in the vacuum chamber 51 to avoid the measure data from being affected due to the thermal dissipation caused by convection, and turn on the vacuum pump 52 to maintain the degree of vacuum inside the vacuum chamber 51 in $4.5 \times 10^{-4}$ mbar, and subsequently, the cryogenic temperature control module 53 is used to adjust measuring ambient temperature.

Orderly arranging the measuring electrodes of internal devices of the power supply 55, the nanovoltmeter 56, the multi-purpose electronic measurer 57 on the contact electrodes of the test piece 80 to provide inputting/outputting electrical signals, and all the electrical signals are transmitted to the processing module 58 to be recorded and analyzed.

Subsequently, the measure which aims to the thermal conductivity k of the nanostructure is to apply microcurrent to the nanostructure on the test piece 80 by the nanovoltmeter 56, the nanostructure generates heat as the resistance thereof, and when the generated joule heat is stable, using the two sets of the multi-purpose electronic measurer 57 disposed on the contact electrode of the test piece 80 to measure the resistance value of the nanostructure through 4-point probes method, and the resistance value and the thermal expansion coefficient of the material itself are converted into temperature by the processing module 58, and formula of one-dimensional heat conduction is used to calculate the thermal conductivity k of the nanostructure.

Furthermore, the measure of Seebeck coefficient S for the nanostructure is to use the power supply 55 to orderly apply heating power by 0-1 W to form a hot end, and the nanovoltmeter 56 is used to measure the corresponding thermal electromotive force curves and to record the resistance values of cold and hot ends to further obtain the thermoelectric efficiency.

Figure 3:
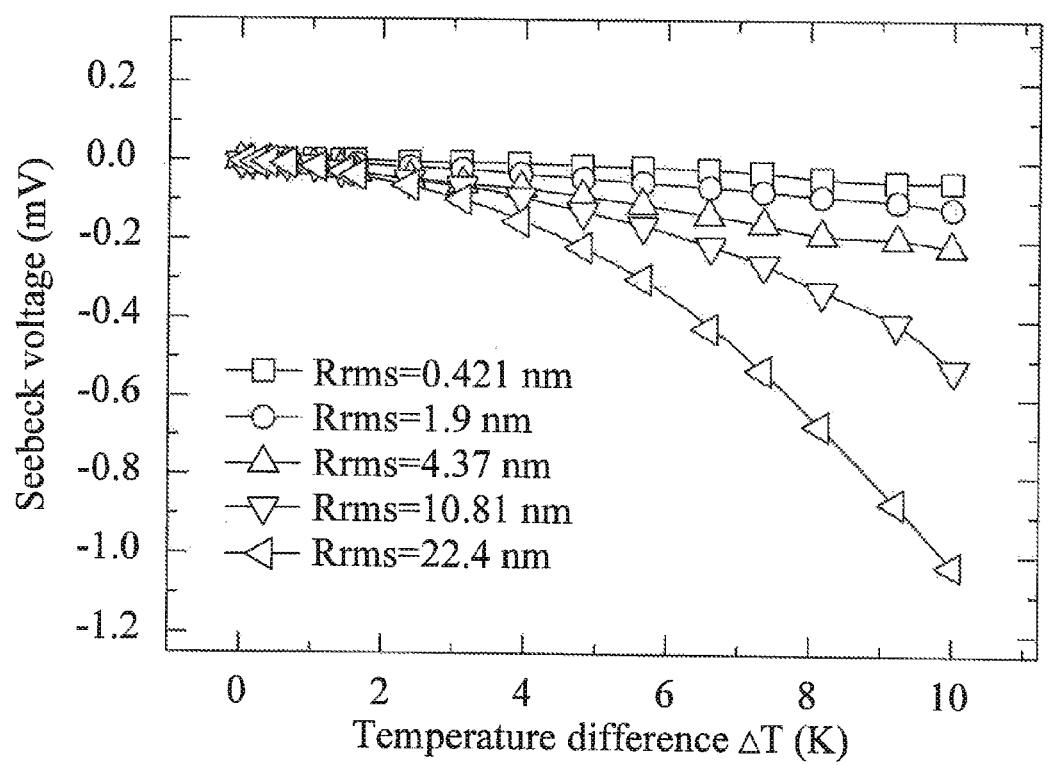
FIG. 3 is an experimental data diagram of the first embodiment of a manufacturing process of a thermoelectric conversion element of the present invention.

Please refer to FIG. 3 which is an experimental data diagram of the first embodiment of a manufacturing process of a thermoelectric conversion element of the present invention. The steps of the manufacturing process disclosed in the present invention are used to manufacture the nickel nanowire having diverse nanoscale surface roughness, and the measuring system 50 shown in FIG. 2A is used to conduct measurements of the related data.

The experimental result shows that as the roughness of the nickel nanowire is controlled within the nanoscale, conductivity thereof will not greatly decrease owing to the roughness. The nickel nanowire having the largest surface roughness has higher thermoelectric effect by a multiple of 4.5 than that of the nickel nanowire having the least surface roughness. Under the circumstances of the temperature difference for two ends of the nanowire is about 10.068K; the thermal electromotive force is up to 0.791 mV.

The reason can be inferred to that the technique disclosed in the present invention is to roughen the surface of the substrate and accordingly deposit the thermoelectric material having a specific thickness, and as the internal structure of the material can be maintained uniformly and percentage of the lattice structure of the material being destroyed can be decrease by depositing technique in the nanoscale, and movement of free electron is affected little, enabling the resistance value of the material with less changes such that the electrical conductivity σ is maintained in a constant with a mere variation.

In addition, the experimental result also proves that when the surface of the nanostructure is of at least two-dimensional variation, it increases the difficulty of transmitting hot carriers such that the thermal conductivity k of the thermoelectric conversion element is decreased and the Seebeck coefficient S has obvious diversity. The thermoelectric conversion element fabricated by the manufacturing process disclosed in the present invention has little change in the electrical conductivity σ, but the Seebeck coefficient S increases clearly and the thermal conductivity k declines, enabling that the entire thermoelectric figure of merit enhances definitely.

Wherein, the deposition thickness of the thermoelectric material is between 5 nm and 5 μm, when the thickness is too thick, the thermoelectric conversion element is unable to lower the thermal conductivity k by the surface microstructure of nanoscale, so the thermal conductivity k of the nanostructure does not decline but increase, such that the entire the thermoelectric figure of merit declines.

The prior art is to construct the thermoelectric conversion element and then the roughening process is conducted on the surface. Although the surface has uneven microstructure after the roughening process is conducted, the entirety of the lattice structure inside the element is also destroyed, enabling the electrical conductivity σ decreasing. Under the circumstances of the thermal conductivity k and the electrical conductivity σ decrease currently, the thermoelectric figure of merit ZT of the thermoelectric conversion element is boosted, though, is not obvious.

Moreover, the present invention is to use metal material as the substrate of the thermoelectric conversion element, theoretically, it is limited by the Wiedemann-Franz law, but the thermoelectric conversion element fabricated by the manufacturing process disclosed in the present invention is able to break the technical threshold set by Wiedemann-Franz law, and is able to apply the metal material which is easy to be obtained and has relative cheaper price to the manufacture of the thermoelectric conversion element. As a result, it not only breaks the limited threshold concerning that the prior art only uses semiconductor material as the substrate, technically, but also manufactures the thermoelectric conversion element with uniform thickness by combining the substrate roughening technique with the disposing technique so as to maintain the finished product having constant effect to meet the industrial practicability.

Figure 4:
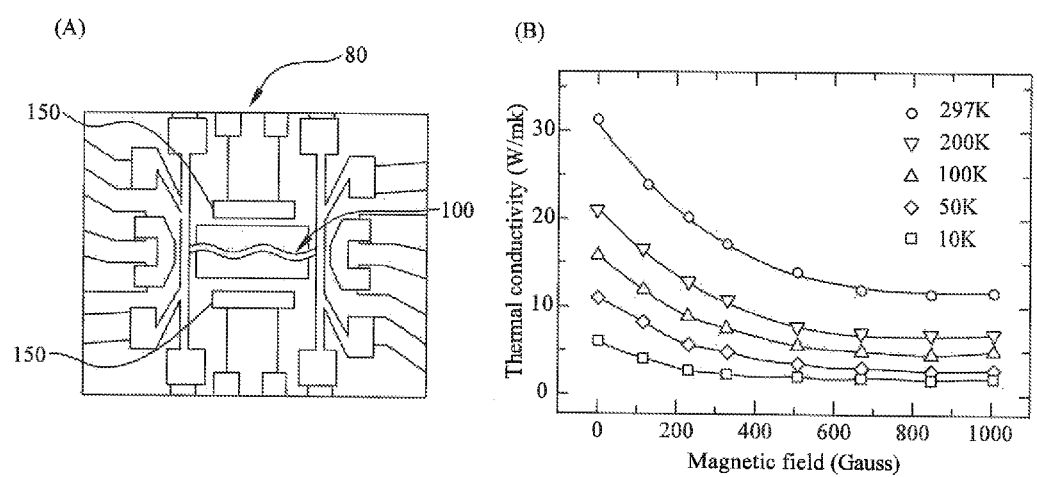
FIG. 4 is a schematic diagram of the second embodiment of a manufacturing process of a thermoelectric conversion element of the present invention.

Please refer to FIG. 4 which is a schematic diagram of the second embodiment of a manufacturing process of a thermoelectric conversion element of the present invention. The thermal conductivity k of the thermoelectric material is affected by the hot carriers which comprise electron, phonon and magneton. The second embodiment is explained aiming to magnetic field, and it can be observed through the FIG. that the changes of the thermal conductivity k of the ferromagnetic nickel nanowire in different temperatures and magnetic field intensities.

Part A of FIG. 4 is a schematic diagram of a ferromagnetic thermoelectric conversion element. It can be seen from the FIG. that the nanostructure in the test piece 80 is a wave nanostructure 100, and the manufacturing procedures thereof are as follows: firstly, providing a substrate and preparing a microstructure having nanoscale and comprising at least two-dimensional variation on a surface of the substrate; and disposing a ferromagnetic thermoelectric material on the microstructure to form the wave nanostructure 100 having uniform thickness and comprising at least two-dimensional variation; and respectively disposing magnetic field electrodes 150 on a direction corresponding to two sides of the wave nanostructure 100; and finally respectively constructing contact electrodes at two ends of the wave nanostructure 100 to provide input/output electrical signal for an external device. Wherein a deposition thickness of the ferromagnetic thermoelectric material is between 5 nm and 5 μm.

In practice, the magnetic field electrodes 150 are used to provide a magnetic field to change the magnetic wall effect of a bending place of the wave nanostructure 100, and to further limit the transmission of hot carriers of electron, phonon and magneton and so on so as to reach purpose of decreasing the thermal conductivity k.

Part B of FIG. 4 is an experimental data diagram. In different temperatures, when the magnetic field applied by the magnetic field electrodes 150 becomes more and more large, control of magnetic moments increase gradually, enabling the magneton being limited and hard to be changes such that the thermal conductivity k is lowered. It can infer via the experimental result that magneton and phonon are engaged with each other; and when the magneton is constrained by the magnetic field gradually, the thermal conductivity k of the phonon is constrained as well. With the declining ambient temperature, amount of magneton and phonon decrease, though, the entire thermal conductivity k lowers, and similarly, the magnetic field is still able to constrain the thermal transmission of magneton and phonon.

In practice, the ferromagnetic thermoelectric conversion element uses the temperature difference produced by the system element to transform into a more valuable electronic energy, and it can be found through the preceding experimental result that the magnetic field is increased so that the thermal conductivity k can be effectively decreased so as to boost the thermoelectric figure of merit ZT. As a result, the electric energy generated by the circuit arrangement is feedbacked to the magnetic field electrodes 150 and it can further boost the thermoelectric figure of merit ZT by increasing the magnetic field intensity so as to obtain better thermoelectric conversion efficiency.

Figure 5:
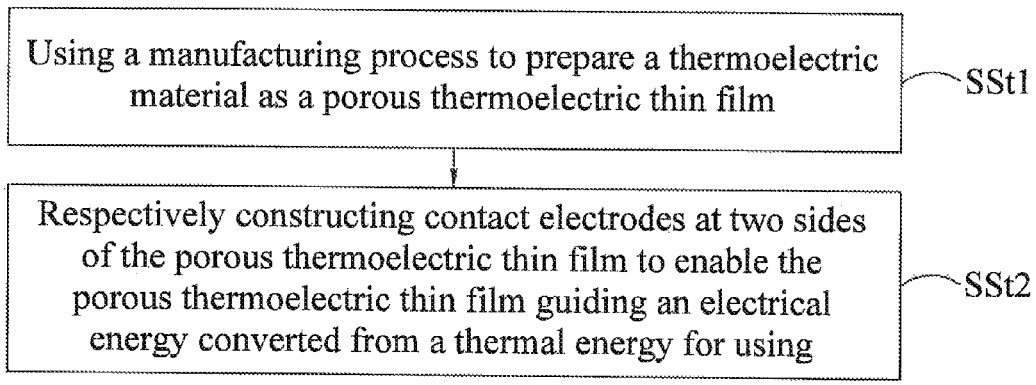
FIG. 5 is a flow chart of steps of a manufacturing process for a thin film aspect of a manufacturing process of a thermoelectric conversion element of the present invention.

Please refer to FIG. 5 which is a flow chart of steps of a manufacturing process for a thin film aspect of a manufacturing process of a thermoelectric conversion element of the present invention. The present invention further provides a manufacturing process of a porous nano thermoelectric thin film, and the steps are as follows: in SSt1, using a manufacturing process to prepare a porous thermoelectric thin film, wherein the manufacturing process of the porous nano thermoelectric thin film comprises a deposition process, a developing process, an etching process or a combination thereof. Discontinuous porous characteristic shown on edge of structure of the porous thermoelectric thin film is used to block the transmitting path of hot carriers so as to change the thermal conductivity k of the thermoelectric material.

Furthermore, when the manufacturing process of the porous thermoelectric thin film is the deposition process, depositing the thermoelectric material on a porous substrate to form the porous thermoelectric thin film. However, with the different thicknesses of the porous substrate, it enables the element to gradually become a thin film structure of nanoscale or micro-scale roughness through the porous reticulated thin film; and similarly, it also contributes the thermoelectric element to boost the thermoelectric figure of merit.

Besides, when the manufacturing process of the porous thermoelectric thin film is the developing process, using a mask having hollow areas to develop to directly manufacture the porous thermoelectric thin film having a reticular structure on the substrate; and when the porous thermoelectric thin film is the etching process, using an etching technique to directly etch the thermoelectric material as the porous thermoelectric thin film having a porous boundary on the thermoelectric material.

Wherein a thickness of the thermoelectric material is between 5 nm and 5 µm. When the thick is too thick, surfaces of the thin film engage with each other, enabling that the decline of the thermal transfer coefficient decreases; to the contrary, when the thickness is too thin, tie strength of the thermoelectric material is not enough and easy to break which leads a completed thin film cannot be formed; consequently, it results the free electron in the thermoelectric material not being able to move smoothly such that the electrical conductivity decreases.

In SSt2, respectively constructing contact electrodes at two ends of the porous thermoelectric thin film to enable the porous thermoelectric thin film guiding an electrical energy converted from a thermal energy for using. Wherein the thermoelectric material comprises a rare earth element compound, a silicon-based material, a semiconductor material, a ferromagnetic material or a metal material, and when the thermoelectric material is the ferromagnetic material, using an external magnetic field to provide diverse magnetic field intensities to change the thermal conductivity k of the thermoelectric material so as to boost the thermoelectric figure of merit ZT.

Figure 6:
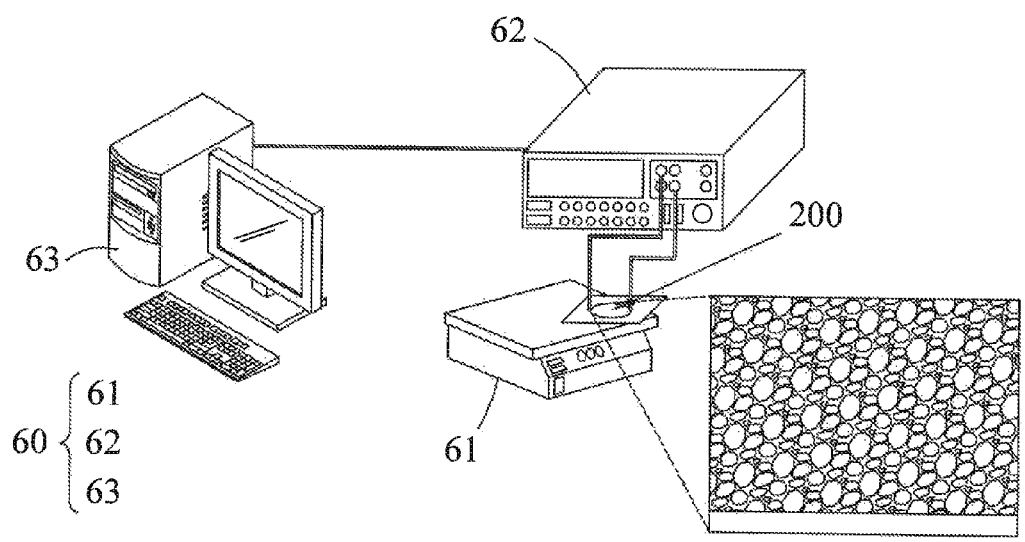
FIG. 6 is a schematic diagram of an arrangement of a measuring system for a finished product of a thin film aspect of a manufacturing process of a thermoelectric conversion element of the present invention.

Please refer to FIG. 6 which is a schematic diagram of an arrangement of a measuring system for a finished product of a thin film aspect of a manufacturing process of a thermoelectric conversion element of the present invention. The related basic property of the porous thermoelectric thin film 200 can be measured by the aforementioned measuring system 50, and the present embodiment tests the porous thermoelectric thin film 200 which is served as a finished product. The finished measuring system 60 comprises a heating platform 61, a nanovoltmeter 62 and a processing module 63. Placing the porous thermoelectric thin film 200 on the heating platform 61 and electrically connecting the electrode measured by the nanovoltmeter 62 to the contact electrodes at two sides of the porous thermoelectric thin film 200 so as to contribute to capture signals, and then the captured signals are transmitted to the processing module 63 to be analyzed and calculated.

Figure 7:
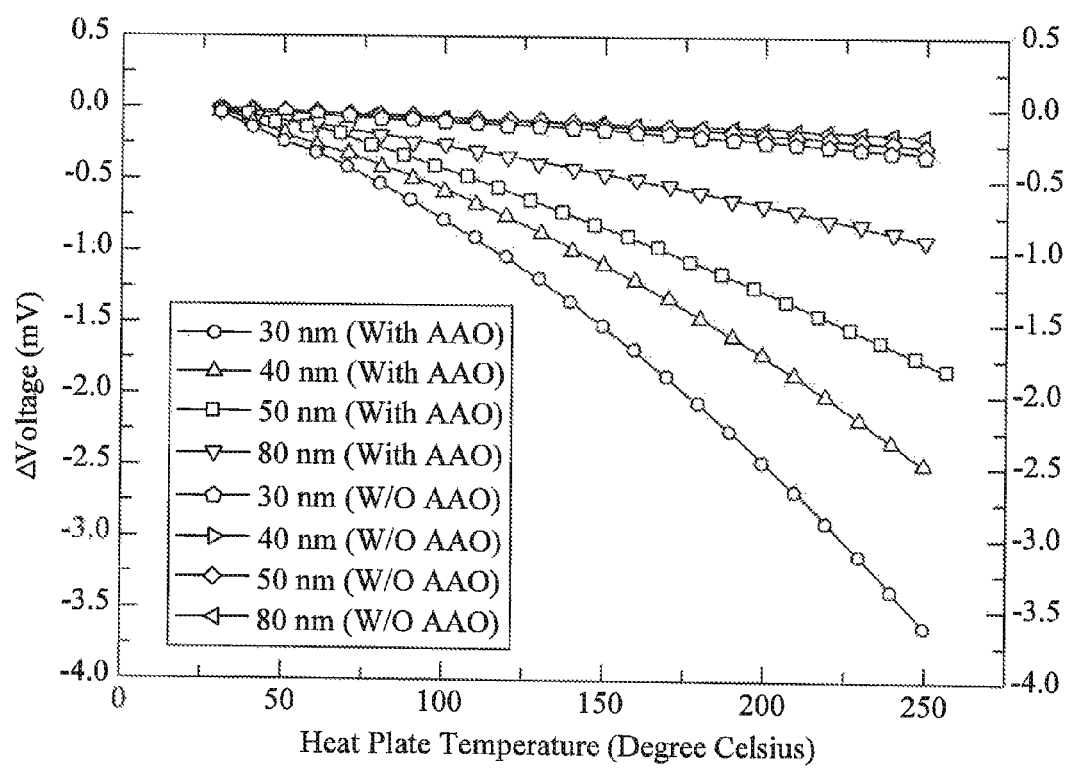
FIG. 7 is an experimental data diagram of the third embodiment of a manufacturing process of a thermoelectric conversion element of the present invention.

Please refer to FIG. 7 which is an experimental data diagram of the third embodiment of a manufacturing process of a thermoelectric conversion element of the present invention. For example, the present embodiment uses an anodic aluminum oxide (AAO) as the porous substrate to construct the porous thermoelectric thin film 200 having different thicknesses (30-80 nm) and being made of metal material, wherein the intervals between a plurality of holes of the AAO substrate are 20 nm.

It can be found through the experimental result that the measured thermoelectric voltage of the porous thermoelectric thin film 200 disposed on the AAO substrate is clearly better than the continuous thin film directly disposed on a glass substrate of a smooth surface; and the experimental result shows that the smaller thickness the porous thermoelectric thin film 200 is, the better the thermoelectric effect is.

A manufacturing process of a thermoelectric conversion element disclosed in the present invention has advantages of breaking the limitation of material and decreasing cost; additionally, it can be found through the experimental result that when the metal material having nanoscale is served as thermoelectric conversion element, the thermoelectric figure of merit thereof is far better than that using the known semiconductor material; and thus, using the existing metal material can ensure the material source and effectively lower the cost so as to decrease the need for rare earth elements greatly.

Moreover, the present invention is to use the semiconductor manufacturing process technique to fabricate the thermoelectric conversion element having nanoscale which is able to be effectively integrated to the electric elements used in the semiconductor industry to convert the waste heat generated by elements of a system into more valuable electric energy to greatly decrease the need of electricity consumption for the electric products as well as to lower the burden to the environment caused by human being so as to reach the purpose of saving energy.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A manufacturing process of a thermoelectric conversion element, comprising:
   a) providing a substrate and manufacturing a microstructure having a nanoscale or a micron-scale roughness and at least comprising two-dimensional variation on the substrate;
   b) disposing a thermoelectric material on the substrate to form an element having a nanoscale or a micron-scale roughness and at least comprising two-dimensional variation; and
   c) respectively constructing contact electrodes at two ends of the element to enable the element guiding an electrical energy converted from a thermal energy for using;
   wherein the manufacturing process of a thermoelectric conversion element further comprises emptying the substrate beneath the element by an etching process to suspend the element.

2. The manufacturing process of a thermoelectric conversion element of claim 1, wherein the thermoelectric material comprises a rare earth element compound, a silicon-based material, a semiconductor material, a ferromagnetic material or a metal material, wherein a deposition thickness of the thermoelectric material is between 5 nm and 5 µm.

3. The manufacturing process of a thermoelectric conversion element of claim 1, wherein the element comprises a straight line, a wave line, a Zigzag line or a thin film in aspect.

4. The manufacturing process of a thermoelectric conversion element of claim 2, wherein when the thermoelectric material is the ferromagnetic material, using a magnetic field to provide diverse magnetic field intensities to change a thermal conductivity of the thermoelectric material so as to boost the thermoelectric figure of merit.

* * * * *